(12) United States Patent
Seo et al.

(10) Patent No.: US 9,257,531 B2
(45) Date of Patent: Feb. 9, 2016

(54) SELF-ALIGNED CONTACT STRUCTURE FOR REPLACEMENT METAL GATE

(71) Applicant: GLOBALFOUNDRIES INC., Grand Cayman (KY)

(72) Inventors: Soon-Cheon Seo, Glenmont, NY (US); Balasubramanian S. Haran, Watervliet, NY (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/481,178

(22) Filed: Sep. 9, 2014

(65) Prior Publication Data

US 2014/0377927 A1    Dec. 25, 2014

Related U.S. Application Data

(62) Division of application No. 13/664,869, filed on Oct. 31, 2012, now Pat. No. 8,928,090.

(51) Int. Cl.
*H01L 21/336* (2006.01)
*H01L 29/66* (2006.01)
(Continued)

(52) U.S. Cl.
CPC ...... *H01L 29/66636* (2013.01); *H01L 21/0223* (2013.01); *H01L 21/02636* (2013.01); *H01L 21/283* (2013.01); *H01L 21/28158* (2013.01); *H01L 21/30604* (2013.01); *H01L 21/823418* (2013.01); *H01L 21/823475* (2013.01); *H01L 21/823814* (2013.01); *H01L 21/823871* (2013.01); *H01L 29/66545* (2013.01); *H01L 29/66628* (2013.01); *H01L 29/7833* (2013.01); *H01L 29/51* (2013.01)

(58) Field of Classification Search
CPC .................. H01L 29/66636; H01L 29/66545; H01L 21/02636; H01L 21/28185
USPC .................................. 438/300; 257/377, 381
See application file for complete search history.

(56) References Cited

U.S. PATENT DOCUMENTS

| 7,888,220 B2 | 2/2011 | Rachmady et al. | |
| 2005/0055494 A1 * | 3/2005 | Doris et al. ................... | 711/103 |

(Continued)

*Primary Examiner* — Theresa T Doan
(74) *Attorney, Agent, or Firm* — Scully, Scott, Murphy & Presser, P.C.

(57) ABSTRACT

A metallic top surface of a replacement gate structure is oxidized to convert a top portion of the replacement gate structure into a dielectric oxide. After removal of a planarization dielectric layer, selective epitaxy is performed to form a raised source region and a raised drain region that extends higher than the topmost surface of the replacement gate structure. A gate level dielectric layer including a first dielectric material is deposited and subsequently planarized employing the raised source and drain regions as stopping structures. A contact level dielectric layer including a second dielectric material is formed over the gate level dielectric layer, and contact via holes are formed employing an etch chemistry that etches the second dielectric material selective to the first dielectric material. Raised source and drain regions are recessed. Self-aligned contact structures can be formed by filling the contact via holes with a conductive material.

14 Claims, 14 Drawing Sheets

(51) Int. Cl.
*H01L 29/78* (2006.01)
*H01L 21/02* (2006.01)
*H01L 21/28* (2006.01)
*H01L 21/283* (2006.01)
*H01L 21/306* (2006.01)
*H01L 21/8234* (2006.01)
*H01L 21/8238* (2006.01)
*H01L 29/51* (2006.01)

(56) References Cited

U.S. PATENT DOCUMENTS

2011/0037105 A1   2/2011   Chang
2011/0156107 A1*  6/2011   Bohr et al. .................... 257/288
2013/0062669 A1*  3/2013   Chen et al. .................... 257/288
2013/0288438 A1   10/2013  Jensen et al.

* cited by examiner

SELF-ALIGNED CONTACT STRUCTURE FOR REPLACEMENT METAL GATE

BACKGROUND

The present disclosure generally relates to semiconductor devices, and particularly to semiconductor structures having a self-aligned contact structure, and methods of manufacturing the same.

Formation of a self-aligned contact structure on a replacement gate structure is very challenging because a trench formed by an etch needs to stop on the replacement gate structure. While formation of an etch stop layer on top of a replacement gate structure has been proposed as a solution, such a solution requires an integration scheme that incorporates deposition and removal of a suitable material. Thus, an integration scheme that allows formation of self-aligned contact structures without requiring formation of an etch stop layer is desired.

SUMMARY

A metallic top surface of a replacement gate structure is oxidized to convert a top portion of the replacement gate structure into a dielectric oxide. After removal of a planarization dielectric layer, selective epitaxy is performed to form a raised source region and a raised drain region that extends higher than the topmost surface of the replacement gate structure. A gate level dielectric layer including a first dielectric material is deposited and subsequently planarized employing the raised source and drain regions as stopping structures. A contact level dielectric layer including a second dielectric material is formed over the gate level dielectric layer, and contact via holes are formed employing an etch chemistry that etches the second dielectric material selective to the first dielectric material. The raised source region and the raised drain region may be recessed below the topmost surface of the replacement gate structure to form a source-side cavity and a drain-side cavity either prior to, or after, formation of the contact level dielectric layer. Self-aligned contact structures can be formed by filling the contact via holes with a conductive material.

According to an aspect of the present disclosure, a semiconductor structure is provided. The semiconductor structure includes a field effect transistor including a raised source region and a raised drain region and located on a substrate, a gate level dielectric layer including a first dielectric material and overlying a gate electrode of the field effect transistor, a contact level dielectric layer including a second dielectric material and overlying the gate level dielectric layer, and a contact via structure electrically shorted to one of the raised source region and raised drain region and extending through the contact level dielectric layer and the gate level dielectric layer as a single contiguous structure. A lower portion of the contact via structure embedded within the gate level dielectric layer is narrower than an upper portion of the contact via structure embedded within the contact level dielectric layer along a horizontal direction parallel to a direction of a channel of the field effect transistor.

According to another aspect of the present disclosure, a method of forming a semiconductor structure is provided. A replacement gate structure is formed, which is embedded within a planarization dielectric layer on a semiconductor substrate. The planarization dielectric layer is removed to physically expose a semiconductor surface. A raised semiconductor structure is formed by depositing a faceted semiconductor material on the physically exposed semiconductor surface to a height above a topmost surface of the replacement gate structure. A first dielectric material is deposited over the replacement gate structure and the raised semiconductor structure. A second dielectric material is deposited over the deposited first dielectric material. A top surface of the raised semiconductor structure is recessed prior to, or after, deposition of the second dielectric material.

DETAILED DESCRIPTION

Figure 1:
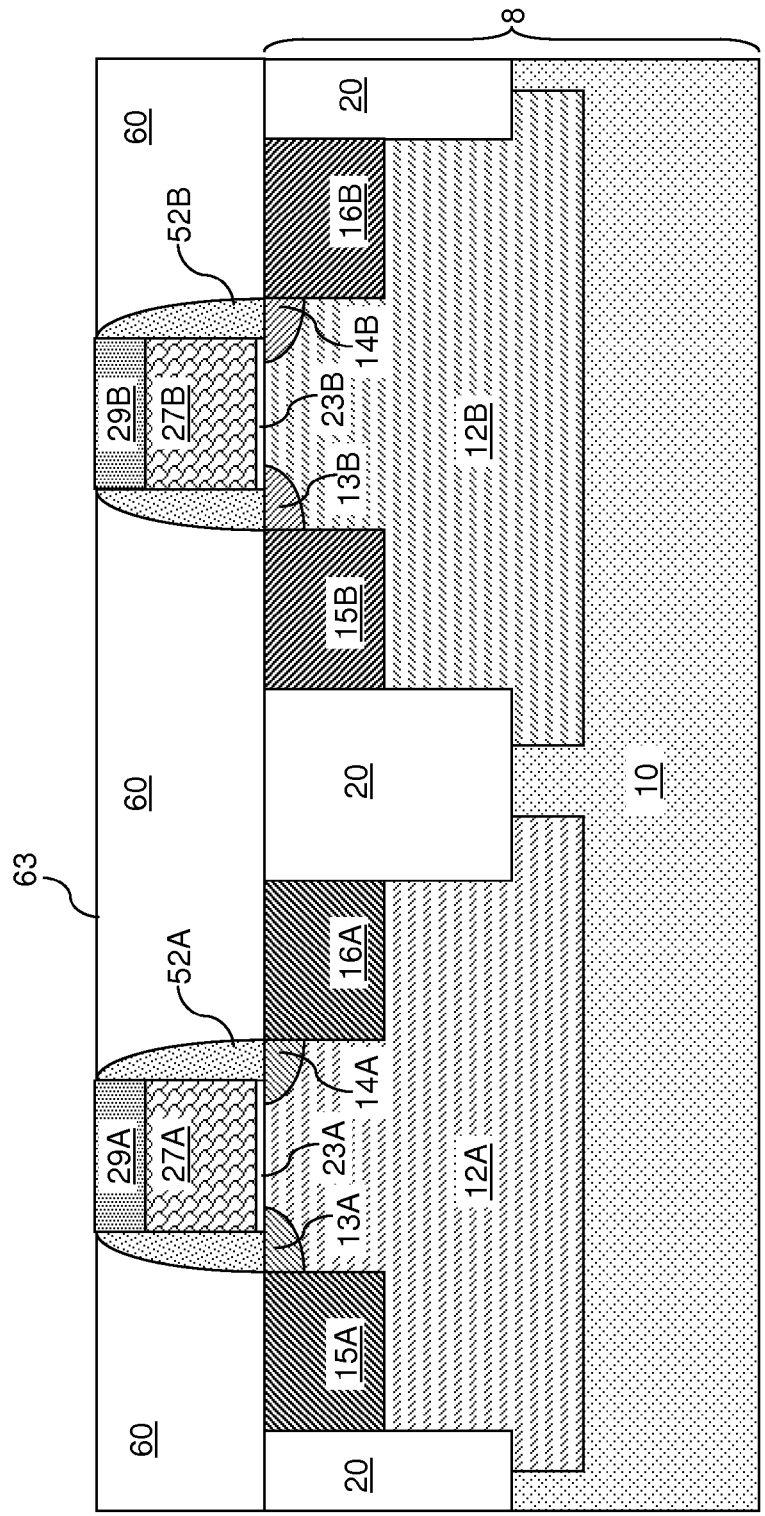
FIG. 1 is vertical cross-sectional view of a first exemplary semiconductor structure after formation of disposable gate structures and formation of a planar dielectric surface on a planarization dielectric layer according to a first embodiment of the present disclosure.

As stated above, the present disclosure relates to semiconductor structures having a self-aligned contact structure, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale.

As used herein, ordinals such as "first" and "second" are employed merely to distinguish similar elements, and different ordinals may be employed to designate a same element in the specification and/or claims.

Referring to FIG. 1, a first exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include an underlying semiconductor layer 10, a first doped well 12A formed in a first device region (the region to the left in FIG. 1), and an second doped well 12B formed in a second device region (the region to the right in FIG. 1). Each of the first doped well 12A and the second doped well 12B can be independently doped with n-type electrical dopants or p-type electrical dopants. Thus, each of the first doped well 12A and the second doped well 12B can be an n-type well or a p-type well. In one embodiment, the first doped well 12A and the second doped well 12B can have opposite types of doping. For example, the first doped well 12A can be a p-doped well and the second doped well 12B can be an n-doped well, or vice versa. The semiconductor material of the first doped well 12A and the second doped well 12B is herein referred to as a first semiconductor material, which can be a single crystalline semiconductor material such as single crystalline silicon, a single crystalline silicon germanium alloy, or any other single crystalline semiconductor material known in the art.

Shallow trench isolation structures 20 can be formed to laterally separate each of the first body region 12A and the second body region 12B. In one embodiment, each of the first body region 12A and the second body region 12B can be laterally surrounded by a contiguous portion of the shallow trench isolation structures 20. If the semiconductor substrate 8 is a semiconductor-on-insulator substrate, bottom surfaces of the first body region 12A and the second body region 12B may contact a buried insulator layer (not shown), which electrically isolates each of the first body region 12A and the second body region 12B from other semiconductor portions of the semiconductor substrate 8 in conjunction with the shallow trench isolation structures 20. Topmost surfaces of the shallow trench isolation structures 20 can be substantially coplanar with, raised above, or recessed below, topmost surfaces of the first body region 12A and the second body region 12B.

Disposable gate level layers are deposited on the semiconductor substrate 8 as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist (not shown) is applied over the topmost surface of the disposable gate level layers and is lithographically patterned by lithographic exposure and development. The pattern in the photoresist is transferred into the disposable gate level layers by an etch, which can be an anisotropic etch such as a reactive ion etch. The remaining portions of the disposable gate level layers after the pattern transfer constitute disposable gate structures.

The disposable gate stacks may include, for example, a first disposable gate structure formed over the first body region 12A in the first device region and a second disposable gate structure formed over the second body region 12B in the second device region. The first disposable gate structure can be a stack of a first disposable gate dielectric portion 23A, a first disposable gate material portion 27A, and a first disposable gate cap portion 29A, and the second disposable gate structure can be a stack of a second disposable gate dielectric portion 23B, a second disposable gate material portion 27B, and a second disposable gate cap portion 29B. The first disposable gate cap portion 29A and the second disposable gate cap portion 29B are remaining portions of the disposable gate cap dielectric layer. The first disposable gate material portion 27A and the second disposable gate material portion 27B are remaining portions of the disposable gate material layer. The first disposable gate dielectric portion 23A and the second disposable gate dielectric portion 23B are remaining portions of the disposable gate dielectric layer.

Ion implantations can be employed to form various source extension regions and drain extension regions. For example, dopants can be implanted into portions of the first body region 12A that are not covered by the first disposable gate structure (23A, 27A, 29A) to form a first source extension region 13A and a first drain extension region 14A. A p-n junction can be formed between the first body region 12A and each of the first source extension region 13A and the first drain extension region 14A. Similarly, dopants can be implanted into portions of the second body region 12B that are not covered by the second disposable gate structure (23B, 27B, 29B) to form a second source extension region 13B and a second drain extension region 14AB. A p-n junction can be formed between the second body region 12B and each of the second source extension region 13B and the second drain extension region 14B.

Gate spacers can be formed on sidewalls of each of the disposable gate structures, for example, by deposition of a conformal dielectric material layer and an anisotropic etch. The gate spacers can include a first gate spacer 52A formed around the first disposable gate structure (23A, 27A, 29A) and a second gate spacer 52B formed around the second disposable gate structure (23B, 27B, 29B).

Ion implantations can be employed to form various source regions and drain regions. For example, dopants can be implanted into portions of the first body region 12A that are not covered by the first disposable gate structure (23A, 27A, 29A) or the first gate spacer 52A to form a first source region 15A and a first drain region 16A. A p-n junction can be formed between the first body region 12A and each of the first source region 15A and the first drain region 16A. Similarly, dopants can be implanted into portions of the second body region 12B that are not covered by the second disposable gate structure (23B, 27B, 29B) or the second gate spacer 52B to form a second source region 15B and a second drain region 16B. A p-n junction can be formed between the second body region 12B and each of the second source region 15B and the second drain region 16B.

A planarization dielectric layer 60 is deposited over the semiconductor substrate 8, the disposable gate structures (29A, 27A, 23A, 29B, 27B, 23A) and the gate spacers (52A, 52B). Preferably, the planarization dielectric layer 60 includes a dielectric material that can be planarized, for example, by chemical mechanical planarization. For example, the planarization dielectric layer 60 can include a doped silicate glass, an undoped silicate glass (silicon oxide), and/or porous or non-porous organosilicate glass.

The planarization dielectric layer 60 is planarized above the topmost surfaces of the first and second disposable gate structures (29A, 27A, 23A, 29B, 27B, 23B). The planarization can be performed, for example, by chemical mechanical planarization (CMP). The planar topmost surface of the planarization dielectric layer 60 is herein referred to as a planar dielectric surface 63.

The combination of the first source extension region 13A, the first drain extension region 14A, the first source region 15A, and the first drain region 16A, and the first doped well 12A can be employed to subsequently form a first field effect transistor. The combination of the second source extension region 13B, the second drain extension region 14B, the second source region 15B, the second drain region 16B, and the second doped well 12B can be employed to subsequently form a second field effect transistor.

Figure 2:
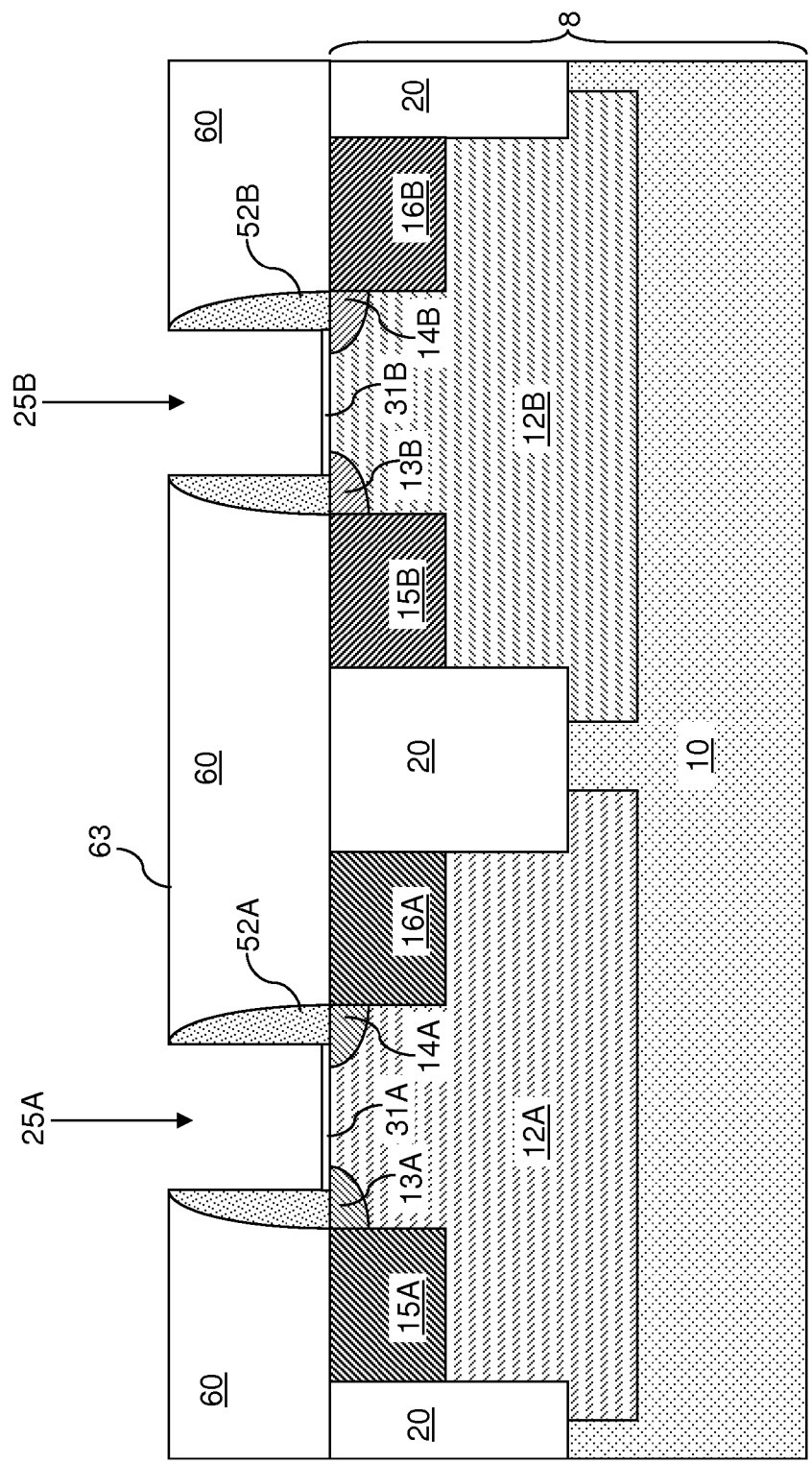
FIG. 2 is a vertical cross-sectional view of the first exemplary semiconductor structure after removal of the disposable gate structures according to the first embodiment of the present disclosure.

Referring to FIG. 2, the first disposable gate structure (29A, 27A, 23A) and the second disposable gate structure (29B, 27B, 23B) are removed by at least one etch. The at least one etch can be a recess etch, which can be an isotropic etch or anisotropic etch. The removal of the disposable gate structures (29A, 27A, 23A, 29B, 27B, 23B) can be performed employing an etch chemistry that is selective to the gate spacers (52A, 52B) and to the dielectric materials of the planarization dielectric layer 60. A first gate cavity 25A and a recessed region 25B are formed in volumes from which the first disposable gate structure (29A, 27A, 23A) and the second disposable gate structure (29B, 27B, 23B) are removed, respectively. The semiconductor surfaces above the first channel and the second channel can be physically exposed at the bottom of the first and second gate cavities (25A, 25B). The first gate cavity 25A is laterally enclosed by the first gate spacer 52A, and the recessed region 25B is laterally enclosed by the second gate spacer 52B.

Optionally, a first interfacial dielectric layer 31A can be formed on the exposed surface of the first doped well 12A by conversion of the exposed semiconductor material into a dielectric material, and a second interfacial dielectric layer 31B can be formed on the exposed surface of the second doped well 12B by conversion of the exposed semiconductor material into the dielectric material. Each of the first and second interfacial dielectric layers (31A, 31B) can be a semiconductor-element-containing dielectric layer. The formation of the interfacial dielectric layers (31A, 31B) can be effected by thermal conversion or plasma treatment. If the semiconductor material of the first doped well 12A and the second doped well 12B includes silicon, the interfacial dielectric layers (31A, 31B) can include silicon oxide or silicon nitride. The interfacial dielectric layers (31A, 31B) contact a semiconductor surface underneath and gate dielectrics to be subsequently deposited thereupon. In one embodiment, the first interfacial dielectric layer 31A and the second interfacial dielectric layer 31B can have a same composition and a same thickness.

Figure 3:
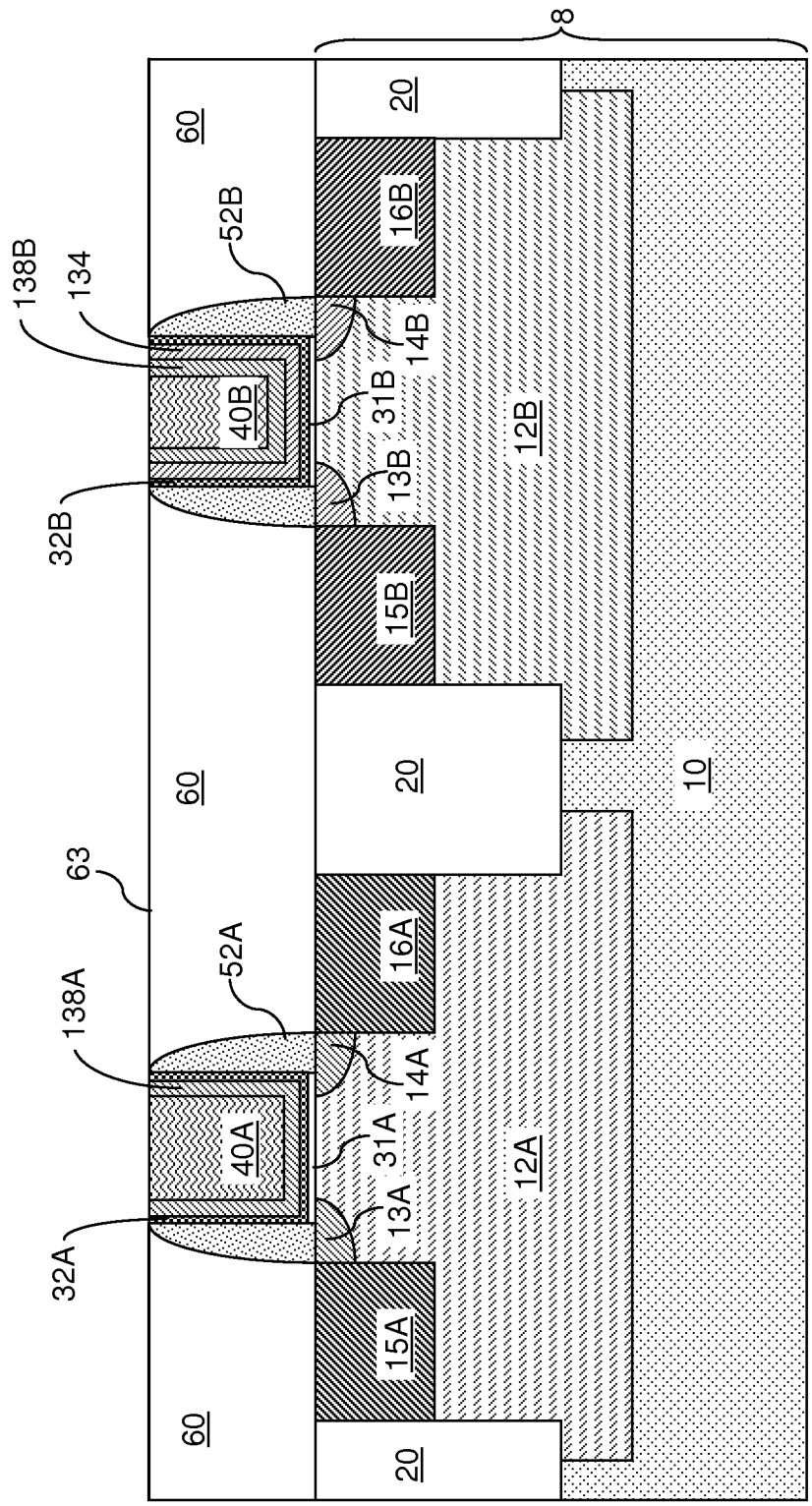
FIG. 3 is a vertical cross-sectional view of the first exemplary semiconductor structure after formation of replacement gate structures according to the first embodiment of the present disclosure.

Referring to FIG. 3, replacement gate structures are formed in the first and second gate cavities (25A, 25B). As used herein, a "replacement gate structure" is a structure formed by replacement of a disposable structure overlying a channel of a field effect transistor with a permanent gate structure. Specifically, a gate dielectric and a gate electrode are formed within each of the first and second gate cavities (25A, 25B). The gate structure that fills the first gate cavity 25A is herein referred to as a first replacement gate structure, and the gate structure that fills the second gate cavity 25B is herein referred to as a second replacement gate structure.

For example, a gate dielectric layer can be deposited on the bottom surface and sidewall surfaces of each gate cavity (25A, 25B) and over the planarization dielectric layer 60. In one embodiment, the gate dielectric layer can be deposited as a contiguous gate dielectric layer that contiguously covers all top surfaces of the planarization dielectric layer 60, all inner sidewall surfaces of the first and second gate spacers (52A, 52B), and all top surfaces of the first and second interfacial dielectric layers (31A, 31B). The gate dielectric layer can be a high dielectric constant (high-k) material layer having a dielectric constant greater than 3.9. The gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32L, as measured at horizontal portions, can be from 0.9 nm to 6 nm, and from 1.0 nm to 3 nm. The gate dielectric layer 32L may have an effective oxide thickness on the order of or less than 2 nm. In one embodiment, the gate dielectric layer 32L is a hafnium oxide ($HfO_2$) layer.

In one embodiment, the first and second replacement gate structures can includes gate electrodes having different compositions. For example, a first work function material layer can be deposited on the gate dielectric layer. The material of the first work function material layer has a first work function, and can be selected from any work function material known in the art. The first work function material layer can include an elemental only, or can include a metallic compound, which includes a metal and a non-metal element.

A photoresist layer (not shown) can be applied and lithographic patterned so that the photoresist layer covers the area over the second doped well 12B, while the top surface of the first work function material layer is exposed over the first doped well 12A. The pattern in the photoresist layer can be transferred into the first work function material layer by an etch. The portion of the first work function material layer within the first gate cavity 25A is removed employing the first photoresist as an etch mask. The etch chemistry employed to remove physically exposed portions of the first work function material layer can be selective to the dielectric material of the gate dielectric layer. Subsequently, the photoresist layer is removed, for example, by ashing or wet etching. After the patterning of the first work function material layer, a remaining portion of the first work function material layer can be present only in the second device region, and not present in the first device region. Correspondingly, the first work function material layer can be present in the second gate cavity 25B, but is not present in the first gate cavity 25A.

Subsequently, a second work function material layer can be deposited. The second work function material layer includes a second metal having a second work function, which can be different from the first work function. The material of the second work function material layer can be selected from any work function material known in the art. The material of the second work function material layer can be selected to optimize the performance of the first field effect transistor to be subsequently formed in the first device region employing the first source extension region 13A, the first drain extension region 14A, the first source region 15A, the first drain region 16A, and the first doped well 12B.

A conductive material layer can be deposited on the second work function material layer 138L. The conductive material layer can include a conductive material deposited by physical vapor deposition, chemical vapor deposition, and/or electroplating. For example, the conductive material layer can be an aluminum layer, a tungsten layer, an aluminum alloy layer, or a tungsten alloy layer, and can be deposited by physical vapor deposition. The thickness of the conductive material layer, as measured in a planar region of the conductive material layer above the top surface of the planarization dielectric layer 60, can be from 30 nm to 500 nm, although lesser and greater thicknesses can also be employed.

Portions of the gate conductor layer, the second work function material layer, the first work function material layer, and the gate dielectric layer are removed from above the planar dielectric surface 63 of the planarization dielectric layer 60 by a planarization process. Replacement gate structures are thus formed, which include the first and second interfacial dielectric layers (31A, 31B) and various remaining portions of the gate conductor layer, the second work function material layer, the first work function material layer, and the gate dielectric layer.

The replacement gate structures include a first replacement gate structures located in the first device region and a second replacement gate structures located in the second device region. Each replacement gate structure overlies a channel region of a field effect transistor. The first replacement gate structure and the second replacement gate structure are formed concurrently.

The first replacement gate structure includes the first interfacial dielectric layer 31A, a first gate dielectric 32A which is a remaining portion of the gate dielectric layer, a work function material portion 138A which is a remaining portion of the second work function material layer, and a first gate conductor portion 40A which is a remaining portion of the gate conductor layer. The work function material portion 138A and the first gate conductor portion 40A collectively constitute a first gate electrode (138A, 40A). The second replacement gate structure includes the second interfacial dielectric layer 31B, a second gate dielectric 32B which is a remaining portion of the gate dielectric layer, a first work function material portion 134 which is a remaining portion of the first work function material layer, a second work function material portion 138B which is a remaining portion of the second work function material layer, and a second gate conductor portion 40B which is a remaining portion of the gate conductor layer 40L. The first work function material portion 134, the second work function material portion 138B, and the second gate conductor portion 40B collectively constitute a second gate electrode (134, 138B, 40B').

The top surface of the first gate electrode (138A, 40A) and the top surface of the second gate electrode (134, 138B, 40B) can be coplanar with the top planar top surface of the planarization dielectric layer 60. The first gate dielectric 32A can be a U-shaped gate dielectric including a horizontal portion that underlies the first gate electrode (138A, 40A) and a vertical portion that laterally surrounds the first gate electrode (138A, 40A). The second gate dielectric 32B can be a U-shaped gate dielectric including a horizontal portion that underlies the second gate electrode (134, 138B, 40B) and a vertical portion that laterally surrounds the second gate electrode (134, 138B, 40B). The outer sidewalls of the first gate dielectric 32A can be in contact with the inner vertical sidewall of the first gate spacer 52A. The outer sidewalls of the second gate dielectric 32B can be in contact with the inner vertical sidewall of the second gate spacer 52B.

Figure 4:
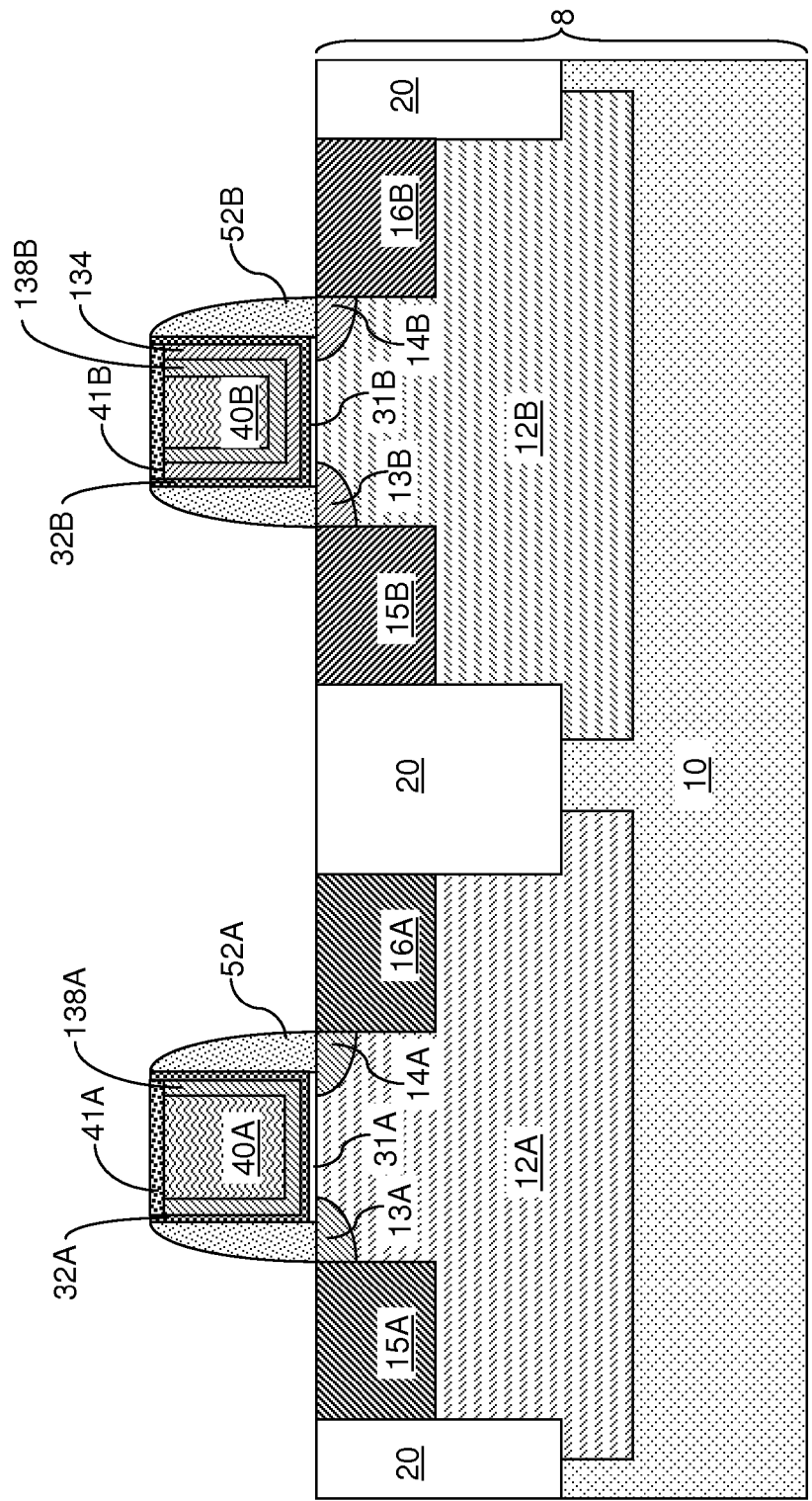
FIG. 4 is a vertical cross-sectional view of the first exemplary semiconductor structure after formation of oxidized material portions on surfaces of the replacement gate structures and removal of the planarization dielectric layer according to the first embodiment of the present disclosure.

Referring to FIG. 4, a surface portion of first replacement gate structure (31A, 32A, 138A, 41A) and a surface portion of the second replacement gate structure (31B, 32B, 138B, 134, 138B, 40B) can be oxidized, for example, by plasma oxidation or thermal oxidation to form a first dielectric metal oxide portion 41A and a second dielectric metal oxide portion 41B, respectively. The first and second dielectric metal oxide portions (41A, 41B) include at least one dielectric metal oxide formed by conversion of physically exposed surface portions of the first gate electrode (138A, 40A) and the second gate electrode (134, 138B, 40B). The thickness of the first and second dielectric metal oxide portions (41A, 41B) can be from 0.6 nm to 10 nm, although lesser and greater thicknesses can also be employed.

The planarization dielectric layer 60 is removed by an etch selective to the first replacement gate structure (31A, 32A, 138A, 41A), the second replacement gate structure (31B, 32B, 138B, 134, 138B, 40B), the gate spacers (52A, 52B), and the semiconductor materials of the first and second source regions (15A, 15B) and the first and second drain regions (16A, 16B). The removal of the planarization dielectric layer 60 can be performed, for example, by an isotropic etch such as a wet etch or a chemical downstream etch, or by an anisotropic etch such as a reactive ion etch. Semiconductor surfaces of the first and second source regions (15A, 15B) and the first and second drain regions (16A, 16B) are physically exposed after removal of the planarization dielectric layer 60.

Figure 5:
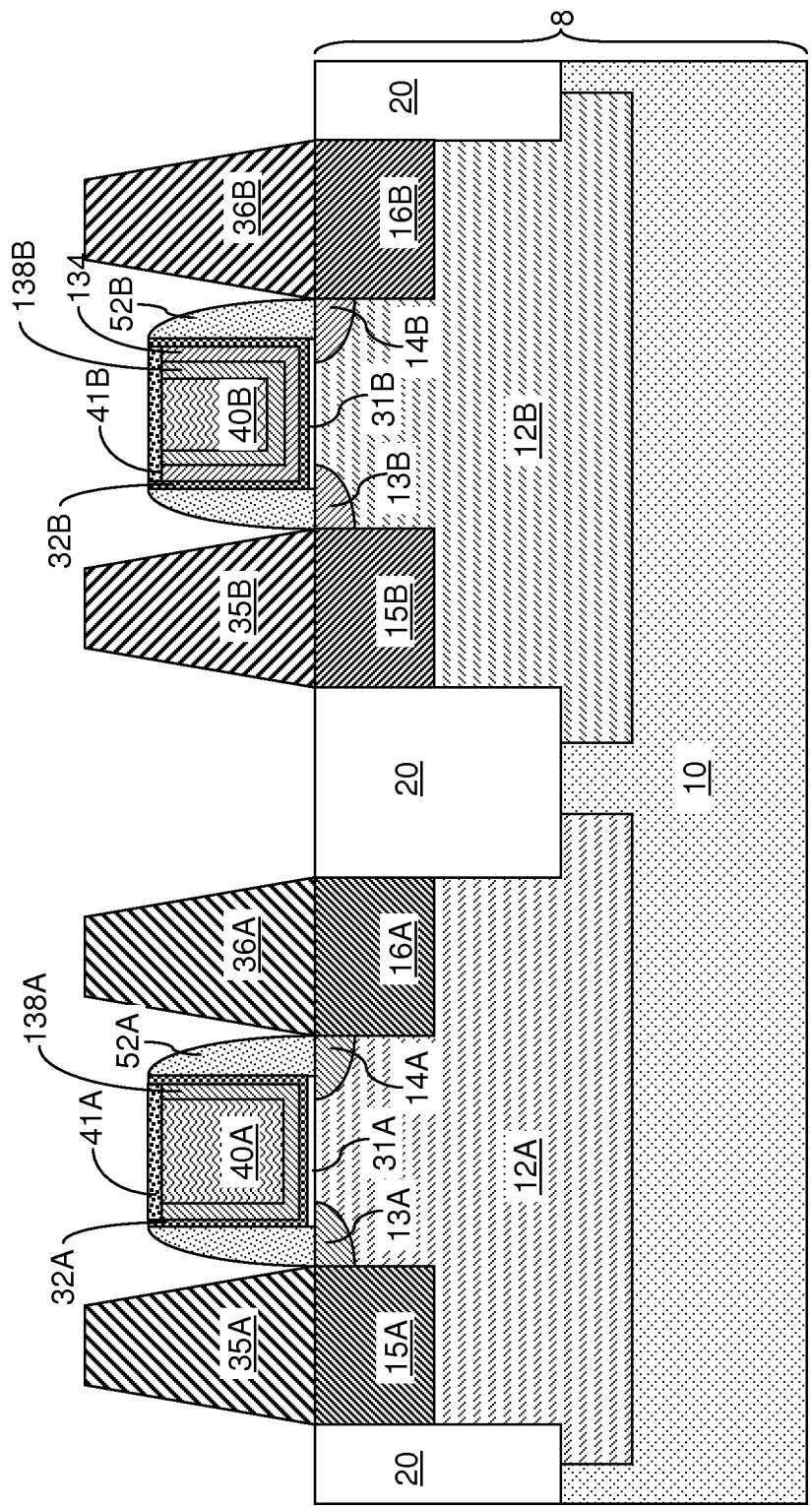
FIG. 5 is a vertical cross-sectional view of the first exemplary semiconductor structure after formation of raised semiconductor structures above topmost surfaces of the replacement gate structures according to the first embodiment of the present disclosure.

Referring to FIG. 5, raised semiconductor structures are formed by selective deposition of a semiconductor material on physically exposed semiconductor surfaces of the semiconductor substrate 8, which include top surfaces of the first source region 15A, the first drain region 16A, the second source region 15B, and the second drain region 16B. The raised semiconductor structures include a first raised source region 35A deposited directly on the first source region 15A, a first raised drain region 36A deposited directly on the first drain region 16A, a second raised source region 35B deposited directly on the second source region 15B, and a second raised drain region 36B deposited directly on the second drain region 16B.

The raised semiconductor structures (35A, 36A, 35B, 36B) can be formed by selectively depositing a semiconductor material. The semiconductor material of the raised semiconductor structures (35A, 36A, 35B, 36B) is deposited selectively only on semiconductor surfaces, and is not deposited on dielectric surfaces. The semiconductor material of the raised semiconductor structures (35A, 36A, 35B, 36B) is herein referred to as a second semiconductor material, and can be the same as, or different from, the first semiconductor material. The second semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the raised semiconductor structures (35A, 36A, 35B, 36B) is single crystalline.

The selective deposition can employ simultaneous or alternating steps of deposition and etch of the second semiconductor material. The deposition is effected by flowing a reactant gas including a precursor for the second semiconductor material in a processing chamber in which the first exemplary semiconductor structure is placed for processing. Exemplary precursors to the second semiconductor material include, but are not limited to, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art. The etch step, which can be performed simultaneously with or in alternation with the deposition step, is effected by flowing an etchant gas in the processing chamber. Exemplary etchants include, but are not limited to, HCl. The selective deposition of the second semiconductor material proceeds at least until the height of the raised semiconductor structures (35A, 36A, 35B, 36B) exceeds the height of the first replacement gate structure (31A, 32A, 138A, 41A) and the second replacement gate structure (31B, 32B, 134, 138B, 41B).

The set of the first raised source region 35A and the first raised drain region 36A and the set of the second raised source region 35B and the second raised drain region 36B can have a doping of the same conductivity type, i.e., p-type or n-type, or can be doped with dopants of different conductivity types. Each of the raised semiconductor structures (35A, 36A, 35B, 36B) can be formed with in-situ doping that is of the same conductivity type as the underlying source/drain region (15A, 16A, 15B, 16B) on which that raised semiconductor structure (35A, 36A, 35B, or 36B) is formed. If the set of the first raised source region 35A and the first raised drain region 36A and the set of the second raised source region 35B and the second raised drain region 36B are doped with dopants of different conductivity types, two separate selective epitaxy processes in conjunction with patterned disposable dielectric material layers (not shown) can be employed to provide different types of in-situ doping for the set of the first raised source region 35A and the first raised drain region 36A and for the set of the second raised source region 35B and the second raised drain region 36B. Alternately, the raised semiconductor structures (35A, 36A, 35B, 36B) can be formed as intrinsic semiconductor material portions, and can be subsequently doped with p-type dopants or n-type dopants by masked ion implantation.

In one embodiment, the various underlying source/drain regions (15A, 16A, 15B, 16B) are single crystalline, and the selective deposition process can be a selective epitaxy process. In this case, each of the raised semiconductor structures (35A, 36A, 35B, 36B) is epitaxially aligned to one of the various underlying source/drain regions (15A, 16A, 15B, 16B). As used herein, a first element is epitaxially aligned to a second element if a single crystalline structure extends throughout the first element and the second element.

In one embodiment, each of the raised semiconductor structures (35A, 36A, 35B, 36B) can be formed with crystallographic facets during the selective epitaxy. The faceting of the raised semiconductor structures (35A, 36A, 35B, 36B) can occur in order to minimize the surface energy during the selective epitaxy. In one embodiment, at least one crystallographic facet having a crystallographic surface can extend from the top surface of the semiconductor substrate 8 to the topmost surface of each of the raised semiconductor structures (35A, 36A, 35B, 36B). An angle of a crystallographic facet of the raised semiconductor structures (35A, 36A, 35B, 36B) relative to the surface normal of the interface between the replacement gate structures (31A, 32A, 138A, 40A, 41A; or 31B, 32B, 134, 138B, 40B; 41B) and the semiconductor substrate 8 is herein referred to as a taper angle. In one embodiment, the taper angle, as measured from the vertical direction, can be, for example, from 5 degrees to 75 degrees.

The height of the raised semiconductor structures (35A, 36A, 35B, 36B) is greater than the height of the replacement gate structures (31A, 32A, 138A, 40A, 41A; or 31B, 32B, 134, 138B, 40B, 41B). In one embodiment, the topmost surfaces of the replacement gate structures (31A, 32A, 138A, 40A, 41A; or 31B, 32B, 134, 138B, 40B, 41B) protrude above the plane of the topmost surfaces of the raised semiconductor structures (35A, 36A, 35B, 36B) by at least 5 nm. In one embodiment, the topmost surfaces of the replacement gate structures (31A, 32A, 138A, 40A, 41A; or 31B, 32B, 134, 138B, 40B, 41B) can protrude above the plane of the topmost surfaces of the raised semiconductor structures (35A, 36A, 35B, 36B) by a vertical distance in a range from 10 nm to 200 nm, although lesser and greater vertical distances can also be employed.

Figure 6:
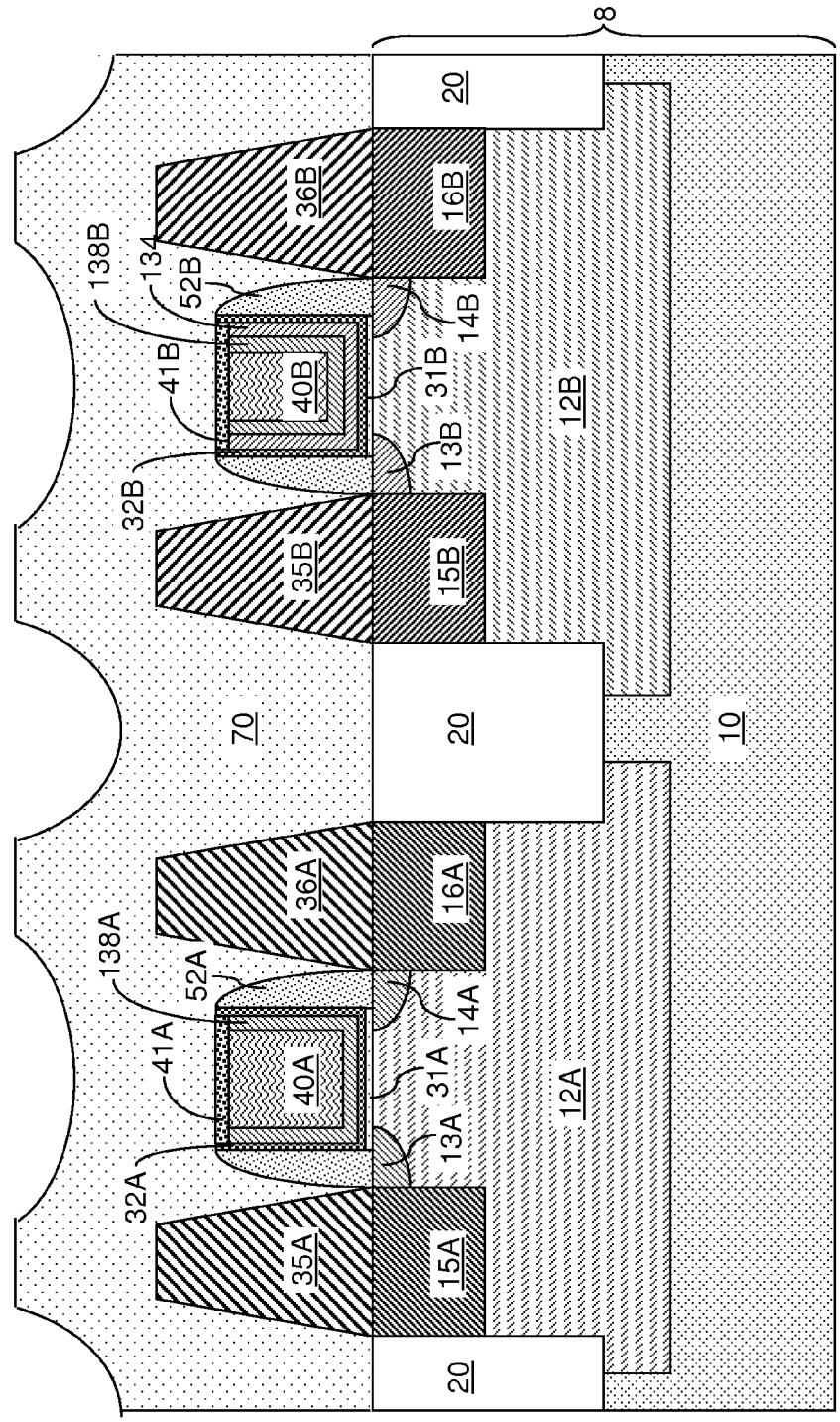
FIG. 6 is a vertical cross-sectional view of the first exemplary semiconductor structure after deposition of a first dielectric material to form a gate level dielectric layer according to the first embodiment of the present disclosure.

Referring to FIG. 6, a first dielectric material is deposited over the replacement gate structures (31A, 32A, 138A, 40A, 41A; or 31B, 32B, 134, 138B, 40B, 41B) and the raised semiconductor structures (35A, 36A, 35B, 36B) to form a gate level dielectric layer 70. The first dielectric material can be silicon oxide, silicon nitride, silicon oxynitride, or combinations thereof. The first dielectric material can be deposited, for example, by chemical vapor deposition (CVD). The duration of deposition of the first dielectric material can be selected such that the lowest surface of the gate level dielectric layer is above the topmost surfaces of the raised semiconductor structures (35A, 36A, 35B, 36B).

Figure 7:
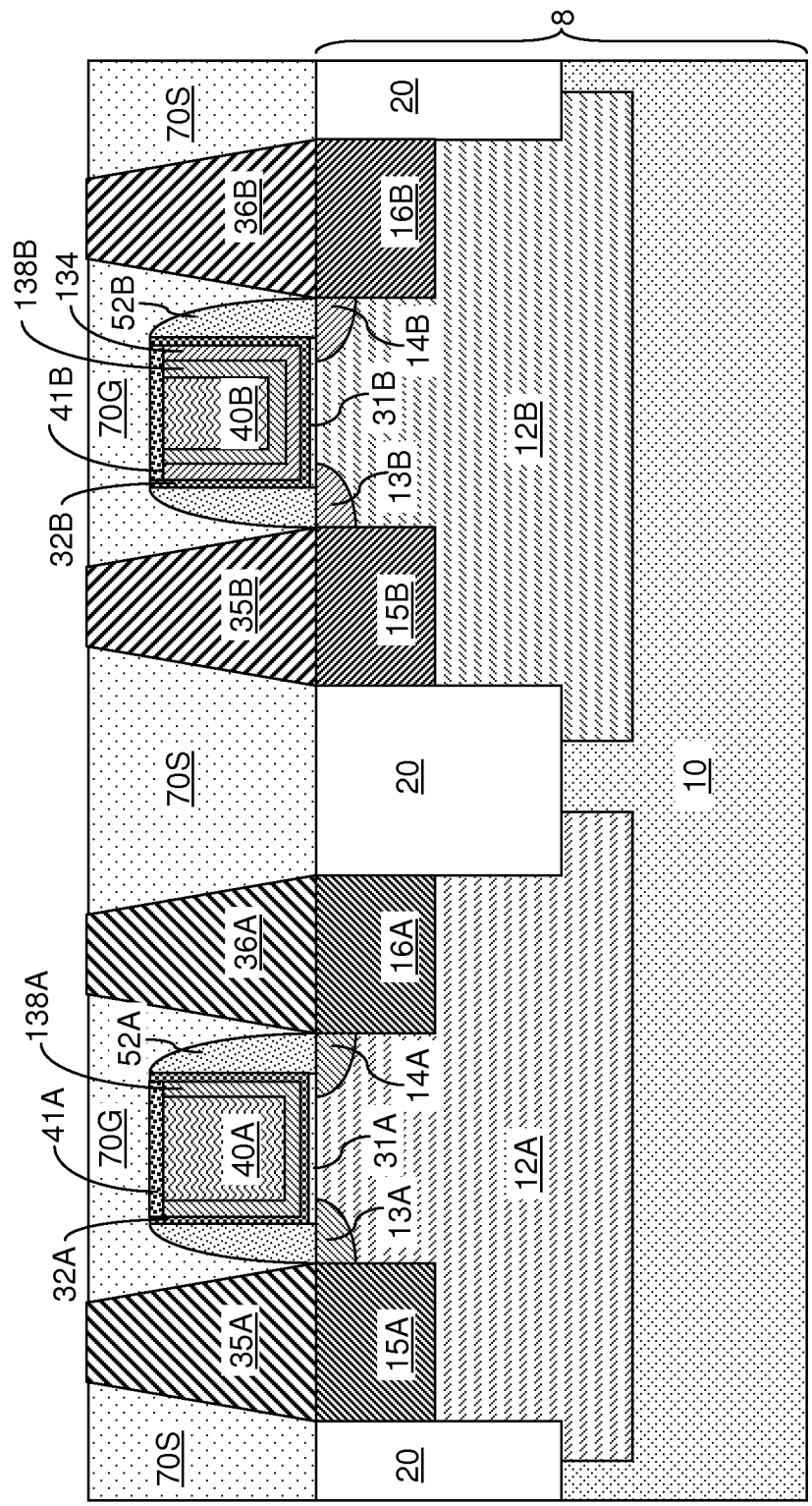
FIG. 7 is a vertical cross-sectional view of the first exemplary semiconductor structure after planarization of the gate level dielectric layer according to the first embodiment of the present disclosure.

Referring to FIG. 7, the gate level dielectric layer 70 is planarized, for example, by chemical mechanical planarization. In one embodiment, the raised semiconductor structures (35A, 36A, 35B, 36B) can be employed as stopping structures during the planarization of the gate level dielectric layer 70.

The remaining portions of the gate level dielectric layer 70 includes gate-overlying gate level dielectric portions 70G that contact and overlie each of the replacement gate structures (31A, 32A, 138A, 40A, 41A; or 31B, 32B, 134, 138B, 40B, 41B), and STI-overlying gate level dielectric portions 70S that contact and overlie shallow trench isolation structures 20. In one embodiment, the gate-overlying gate level dielectric portions 70G and the STI-overlying gate level dielectric portions 70S collectively constitute the gate level dielectric layer (70G, 70S), which is a single contiguous structure.

Figure 8:
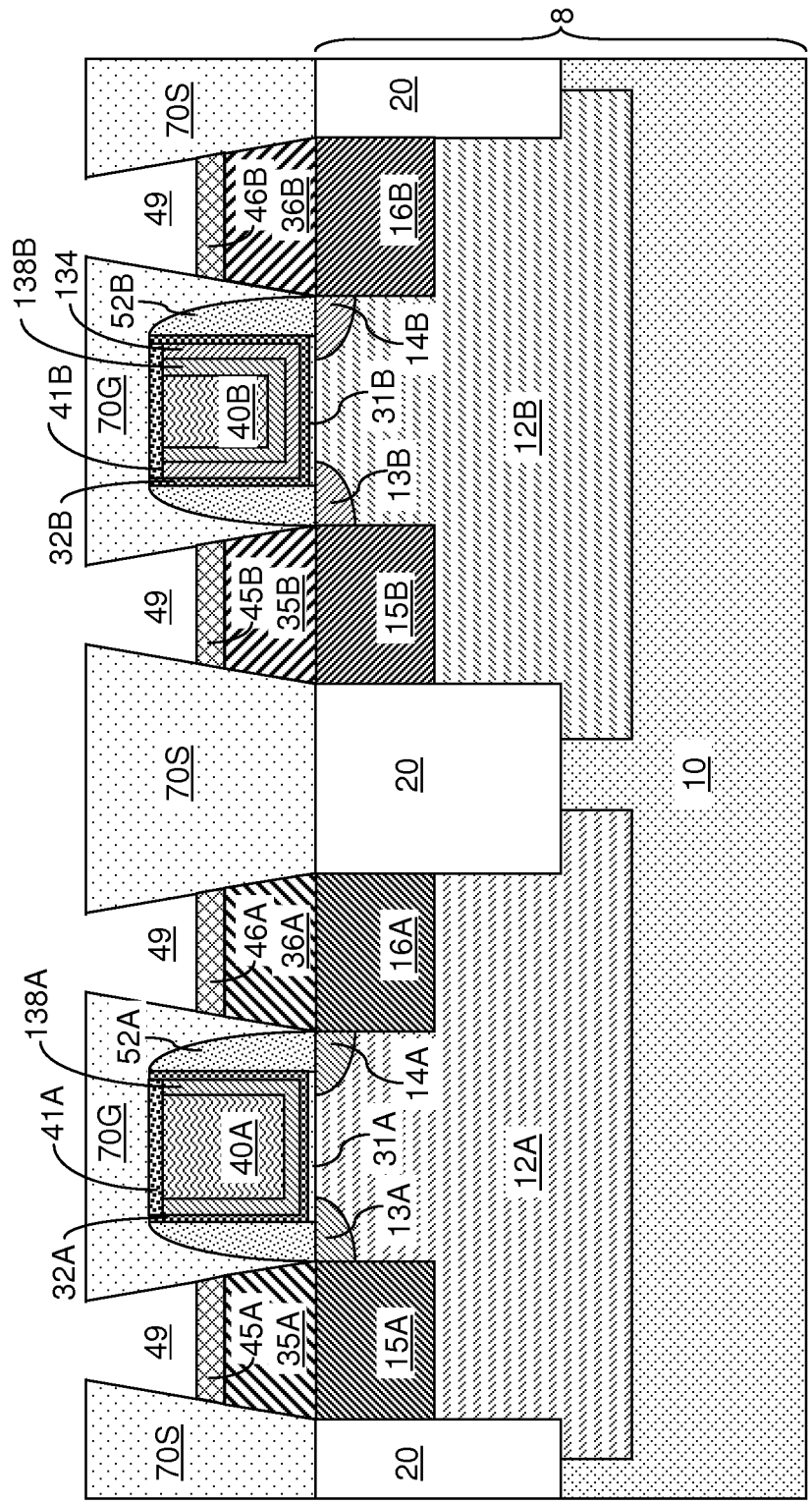
FIG. 8 is a vertical cross-sectional view of the first exemplary semiconductor structure after recessing top surfaces of raised semiconductor structures according to the first embodiment of the present disclosure.

Referring to FIG. 8, top surfaces of raised semiconductor structures (35A, 36A, 35B, 36B) are vertically recessed by an etch that selectively removes the second semiconductor material of the (35A, 36A, 35B, 36B) relative to the first dielectric material of the gate level dielectric layer (70G, 70S). The etch can be an isotropic etch such as a wet etch or a chemical downstream etch (CDE), or can be an anisotropic etch such as a reactive ion etch.

A cavity 49 laterally surrounded by the gate level dielectric layer (70G, 70S) is formed above each of the raised semiconductor structures (35A, 36A, 35B, 36B) after the vertical recessing of the second semiconductor material. The recessed surfaces of the raised semiconductor structures (35A, 36A, 35B, 36B) can be located below, at, or above the topmost surfaces of the replacement gate structures (31A, 32A, 138A, 40A, 41A; or 31B, 32B, 134, 138B, 40B, 41B). Optionally, a metal-semiconductor alloy region can be formed at the bottom of each cavity 49 by depositing a metal layer within the cavities 49, for example, by chemical vapor deposition (CVD) or by physical vapor deposition (PVD), reacting the metal layer with the underlying second semiconductor material, and subsequently removing unreacted portions of the metal layer. The metal-semiconductor alloy regions can include, for example, a first source-side metal-semiconductor alloy region 45A that is formed directly on the first raised source region 35A, a first drain-side metal-semiconductor alloy region 46A that is formed directly on the first raised drain region 36A, a second source-side metal-semiconductor alloy region 45B that is formed directly on the second raised source region 35B, and a second drain-side metal-semiconductor alloy region 46B that is formed directly on the second raised drain region 36B. In one embodiment, the raised semiconductor structures (35A, 36A, 35B, 36B) can include silicon, and the metal-semiconductor alloy regions (45A, 46A, 45B, 46B) can include a metal silicide.

In one embodiment, the sidewalls of each cavity 49 can be planar surfaces that replicate the locations of crystallographic surfaces of the removed portions of the raised semiconductor structures (35A, 36A, 35B, 36B). The horizontal cross-sectional area of each cavity 49 can decrease strictly with a vertical distance from the top surface of the semiconductor substrate 8.

Figure 9:
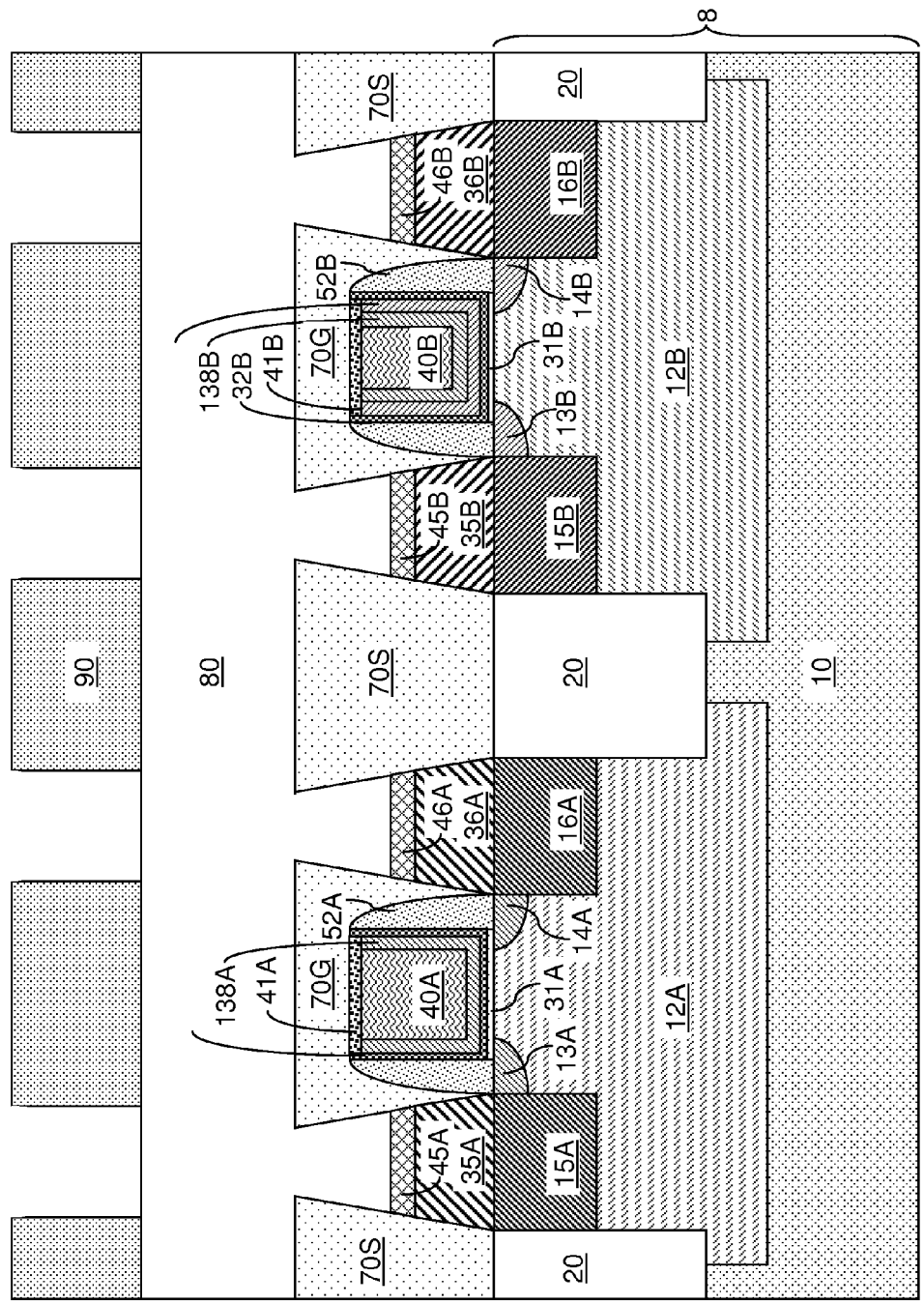
FIG. 9 is a vertical cross-sectional view of the first exemplary semiconductor structure after deposition of a second dielectric material to form a contact level dielectric layer and deposition and patterning of an optional dielectric cap layer according to the first embodiment of the present disclosure.

Referring to FIG. 9, a second dielectric material is deposited over the gate level dielectric layer (70G, 70S) and the raised semiconductor structures (35A, 36A, 35B, 36B) to form a contact level dielectric layer 80. The second dielectric material is different from the first dielectric material, and can be a porous or non-porous organosilicate glass, silicon oxide, silicon oxynitride, or combinations thereof. The second dielectric material can be deposited, for example, by chemical vapor deposition (CVD). Optionally, the second dielectric material can be self-planarizing, or can be planarized, for example, by chemical mechanical planarization. A portion of the second dielectric material is deposited directly over recessed top surfaces of the raised semiconductor structures (35A, 36A, 35B, 36B) and below a planar interface between the second dielectric material and the first dielectric material, i.e., below the planar top surface of the gate level dielectric layer (70G, 70S). The contact level dielectric layer 80 may, or may not, have a planar top surface. An optional dielectric cap layer 90 may be deposited over the contact level dielectric layer 80.

In one embodiment, the first dielectric material is silicon oxide, silicon nitride, silicon oxynitride, or a combination thereof, and the second dielectric material can be a porous or non-porous organosilicate glass. In this case, the material of the optional dielectric cap layer 90 may be silicon oxide, silicon nitride, silicon oxynitride, or a combination thereof. In another embodiment, the first dielectric material can be silicon nitride or silicon oxynitride, and the second dielectric material can be silicon oxide. In this case, the material of the optional dielectric cap layer 90 may be silicon nitride or silicon oxynitride. In yet another embodiment, the first dielectric material can be silicon oxide, silicon nitride, silicon oxynitride, non-porous organosilicate glass, and the second dielectric material can be a porous organosilicate glass. In this case, the material of the optional dielectric cap layer 90 may be silicon oxide, silicon nitride, silicon oxynitride, non-porous organosilicate glass, or a combination thereof.

A patterned layer is formed above the contact level dielectric layer 80. The patterned layer includes a pattern for contact via structures to be subsequently formed through the contact level dielectric layer 80. In one embodiment, the patterned layer is the optional dielectric cap layer 90, which is patterned, for example, by applying a photoresist layer (not shown) thereupon, lithographically exposing and developing the photoresist layer with the pattern for contact via structures to be subsequently formed, and transferring the pattern into the optional dielectric cap layer 90 by an etch, which can be an anisotropic etch. The photoresist layer may be subsequently removed, for example, by ashing. Alternatively, the optional dielectric cap layer 90 may not be present, and the photoresist layer may be deposited directly on the surface of the contact level dielectric layer 80, and can be subsequently patterned with the pattern for contact via structures to be subsequently formed.

Figure 10:
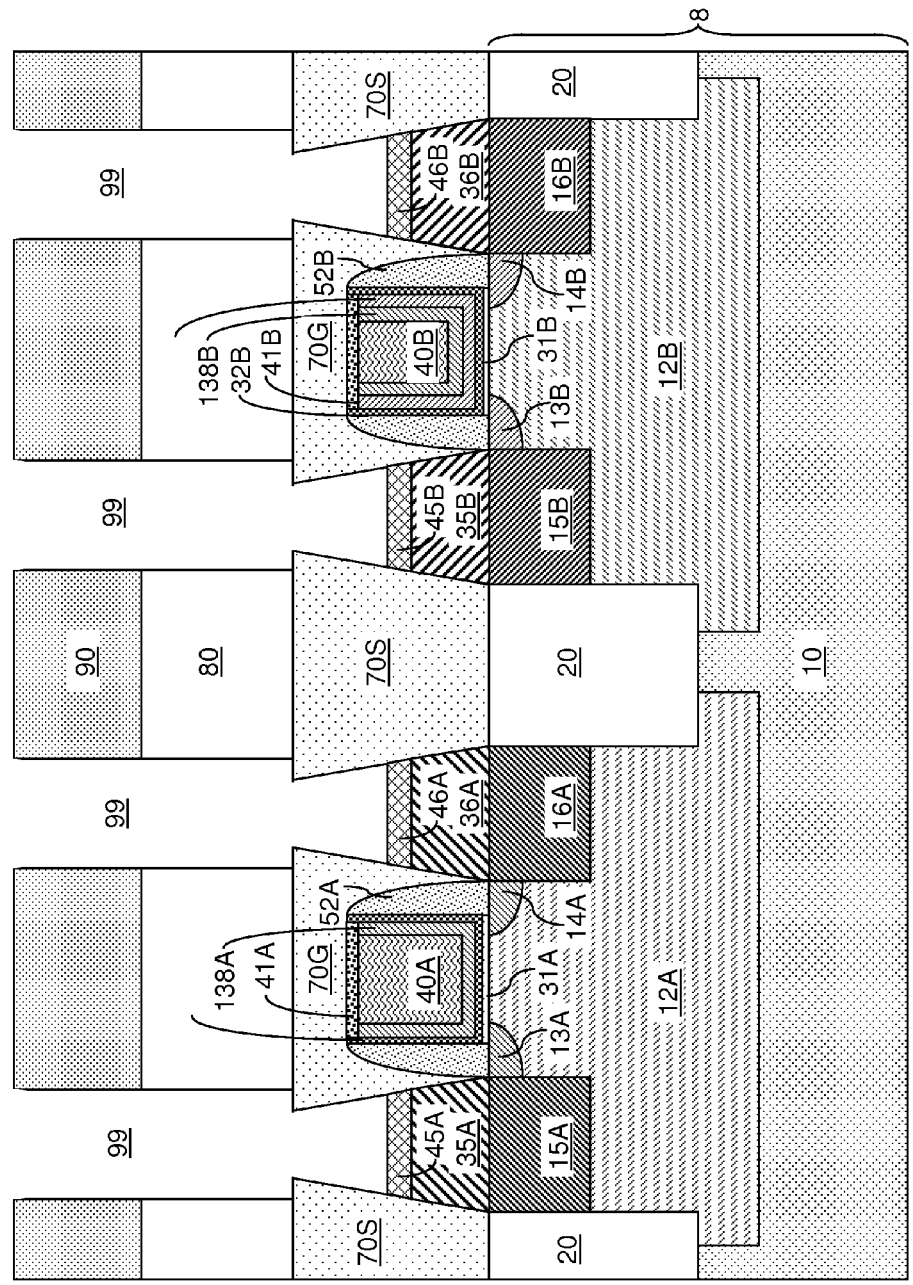
FIG. 10 is a vertical cross-sectional view of the first exemplary semiconductor structure after formation of contact cavities according to the first embodiment of the present disclosure.

Referring to FIG. 10, the pattern in the optional dielectric cap layer 90 (if the optional dielectric cap layer 90 is present), or the pattern in the photoresist layer (not shown; if an optional dielectric cap layer is not present), is transferred through underlying portions of the contact level dielectric layer 80 to form contact cavities 99. Specifically, each contact cavity 99 is formed by etching a first portion of the second dielectric material below the top surface of the contact level dielectric layer 80 and above the top surface of the gate level dielectric layer (70G, 70S) during a first part of an anisotropic etch, and by etching a second portion of the second dielectric material below the top surface of the gate level dielectric layer (70G, 70S) and above one of the raised semiconductor structures (35A, 36A, 35B, 36B) during a second part of the anisotropic etch. The etch chemistry of the anisotropic etch can be selected such that the anisotropic etch removes the second dielectric material selective to the first dielectric material, i.e., removes the second dielectric material without significantly etching the first dielectric material. For example, the etch rate of the second dielectric material during the anisotropic etch can be greater than the etch rate of the first dielectric material by a factor, which can be greater than 3, or greater than 10, or greater than 30.

The pattern for the contact via structures can be selected such that contact cavities 99 overlie the raised semiconductor structures (35A, 36A, 35B, 36B). Thus, a portion of the second dielectric material overlying a raised semiconductor structures (35A, 36A, 35B, or 36B) is etched between the top surface of the contact level dielectric layer 80 and the top surface of the gate level dielectric layer (70G, 70S) to form an upper portion of a contact cavity 99, and another portion of the second semiconductor material overlying the raised semiconductor structures (35A, 36A, 35B, or 36B) can be removed from below the top surface of the gate level dielectric layer (70G, 70S) to form a lower portion of the contact cavity 99. The lower portion of the contact cavity 99 is embedded within the first dielectric material, and the upper portion of the contact cavity 99 is embedded within the second dielectric material. The lower portion of the contact cavity 99 is narrower than an upper portion of the contact cavity 99. Each contact cavity 99 can include a ledge located at an interface between the first dielectric material and the second dielectric material. Alternately, the ledge may be located below the interface between the first dielectric material and the second dielectric material if the first dielectric material is eroded at the ledge during the anisotropic etch due to imperfect selectivity, i.e., a selectivity that is not infinity.

Figure 11:
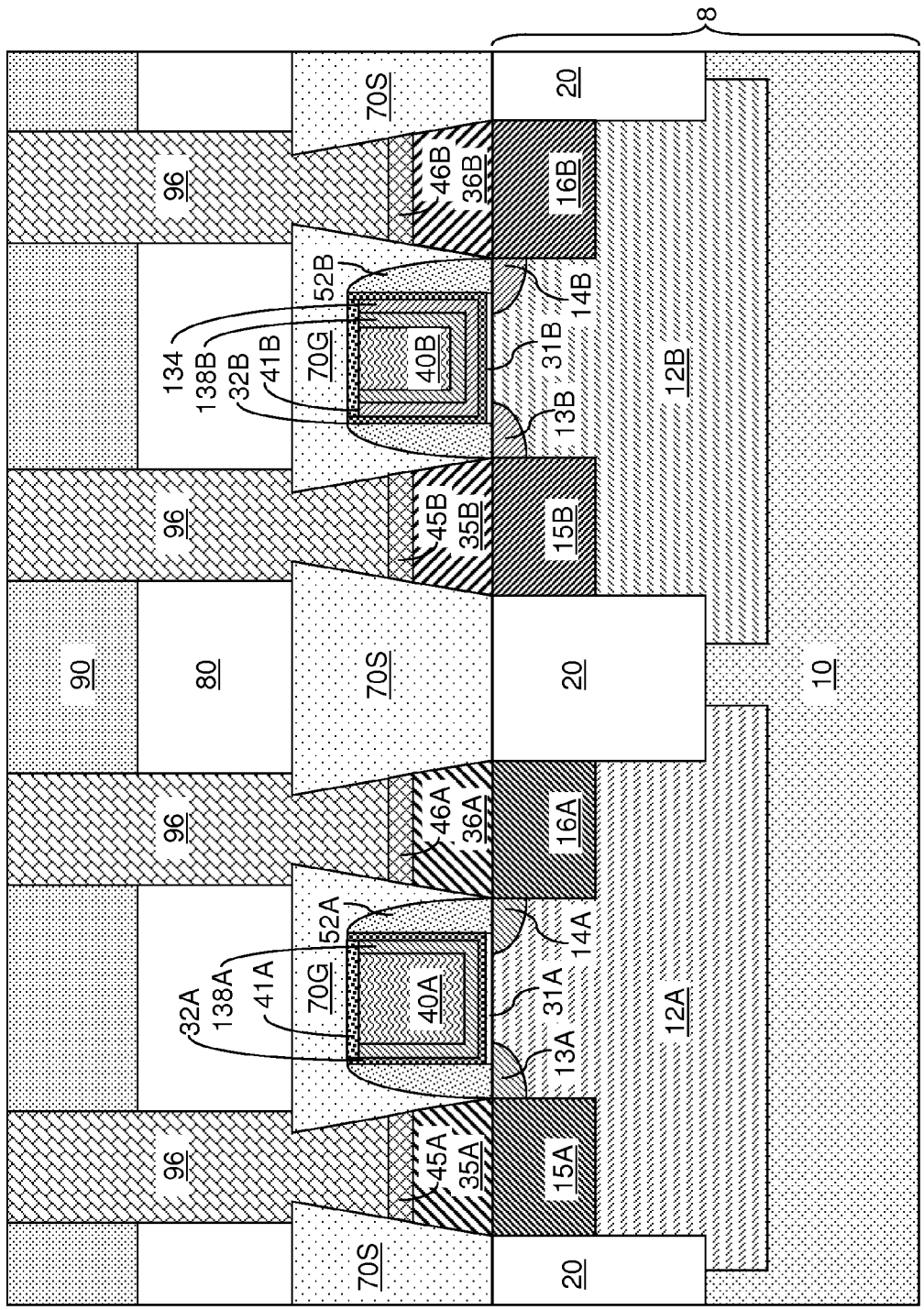
FIG. 11 is a vertical cross-sectional view of the first exemplary semiconductor structure after formation of contact via structures according to the first embodiment of the present disclosure.

Referring to FIG. 11, a conductive material is deposited within each contact cavity 99, for example, by chemical vapor deposition (CVD), physical vapor deposition (PVD), electroplating, electroless plating, or any other method for depositing the conductive material. The conductive material can include a metal (such as Cu, W, Al, etc.) and/or a conductive metallic nitride (TiN, TaN, WN, etc.) and/or a conductive metallic carbide (TiC, TaC, etc.) and/or a doped semiconductor material. Excess conductive material is removed from above the top surface of the optional dielectric cap layer 90 (if the optional dielectric cap layer 90 is present), or from above the top surface of the contact level dielectric layer 90 (if an optional dielectric cap layer is not present). The removal of the excess conductive material can be performed, for example, by a recess etch and/or chemical mechanical planarization (CMP). Each remaining portion of the conductive material within each contact cavity 99 constitutes a contact via structure 96.

The first exemplary semiconductor structure includes a field effect transistor (either the first field effect transistor formed on the first doped well 12A in the first device region or the second field effect transistor formed on the second doped well 12B in the second device region) including a raised source region (35A or 35B) and a raised drain region (36A or 36B) and located on a substrate (i.e., the semiconductor substrate 8); a gate level dielectric layer (70G, 70S) including a first dielectric material and overlying a gate electrode (the first gate electrode (138A, 40A) or the second gate electrode (134, 138B, 40B) of the field effect transistor; a contact level dielectric layer 80 including a second dielectric material and overlying the gate level dielectric layer (70G, 70S); and a contact via structure 96 electrically shorted to one of the raised source region (35A or 35B) and raised drain region (36A or 36B) and extending through the contact level dielectric layer 80 and the gate level dielectric layer (70G, 70S) as a single contiguous structure. A lower portion of the contact via structure 96 embedded within the gate level dielectric layer (70G, 70S) is narrower than an upper portion of the contact via structure 96 embedded within the contact level dielectric layer 80 along a horizontal direction parallel to the direction of the field effect transistor (i.e., the horizontal direction as illustrated in FIG. 11).

The lower portion of each contact via structure 96 has a lateral width that decreases with a vertical distance from an interface between the semiconductor substrate 10 and the gate level dielectric layer (70G, 70S) due to the finite taper angle of the outer surfaces of the lower portion of the contact via structure 96. The upper portion of the contact via structure 96 has a substantially uniform width that is invariant with translation along the vertical direction (from which the taper angle is defined for each outer surface of lower portions of the contact via structures 96). As used herein, an element has a substantially uniform width if the variation of the width does not exceed natural variation on the surface roughness of the element introduced during processing steps.

In one embodiment, sidewalls of the lower portion of the contact via structure 96 can have a non-zero taper angle, which can be in a range from 5 degrees to 75 degrees. Each of the raised source regions (35A, 35B) and the raised drain regions (36A, 36B) can have a taper angle that is not less than the taper angle of a lower portion of a contact via structure 96 that overlies that the raised source region (35A or 35B) or that raised drain region (36A or 36B). Sidewalls of the lower portion of each contact via structure 96 can be located within the same planes as the faceted crystallographic surfaces of an underlying raised source region (35A or 35B) or an underlying raised drain region (36A or 36B).

In one embodiment, a metal-semiconductor alloy region (45A, 46A, 45B, or 46B) contacting a bottom surface of the contact via structure 96 can be provided. Sidewalls of the metal-semiconductor alloy region (45A, 46A, 45B, or 46B) can have the same taper angle as the non-zero taper angle of the lower portion of the contact via structure 96 that overlies that metal-semiconductor alloy region (45A, 46A, 45B, or 46B).

Each lower portion of the contact via structure 96 can have sidewalls having a taper angle relative to a surface normal of the interface between the semiconductor substrate 8 and the gate level dielectric layer (70G, 70S). The second semiconductor material of the raised source regions (35A, 35B) and the raised drain regions (36A, 36B) can be the same as, or can be different from, the first semiconductor material of the first and second source regions (15A, 15B) and the first and second drain regions (16A, 16B). In one embodiment, all interfaces between the gate level dielectric layer (70G, 70S) and the contact level dielectric layer 80 can be within the same horizontal plane.

Figure 12:
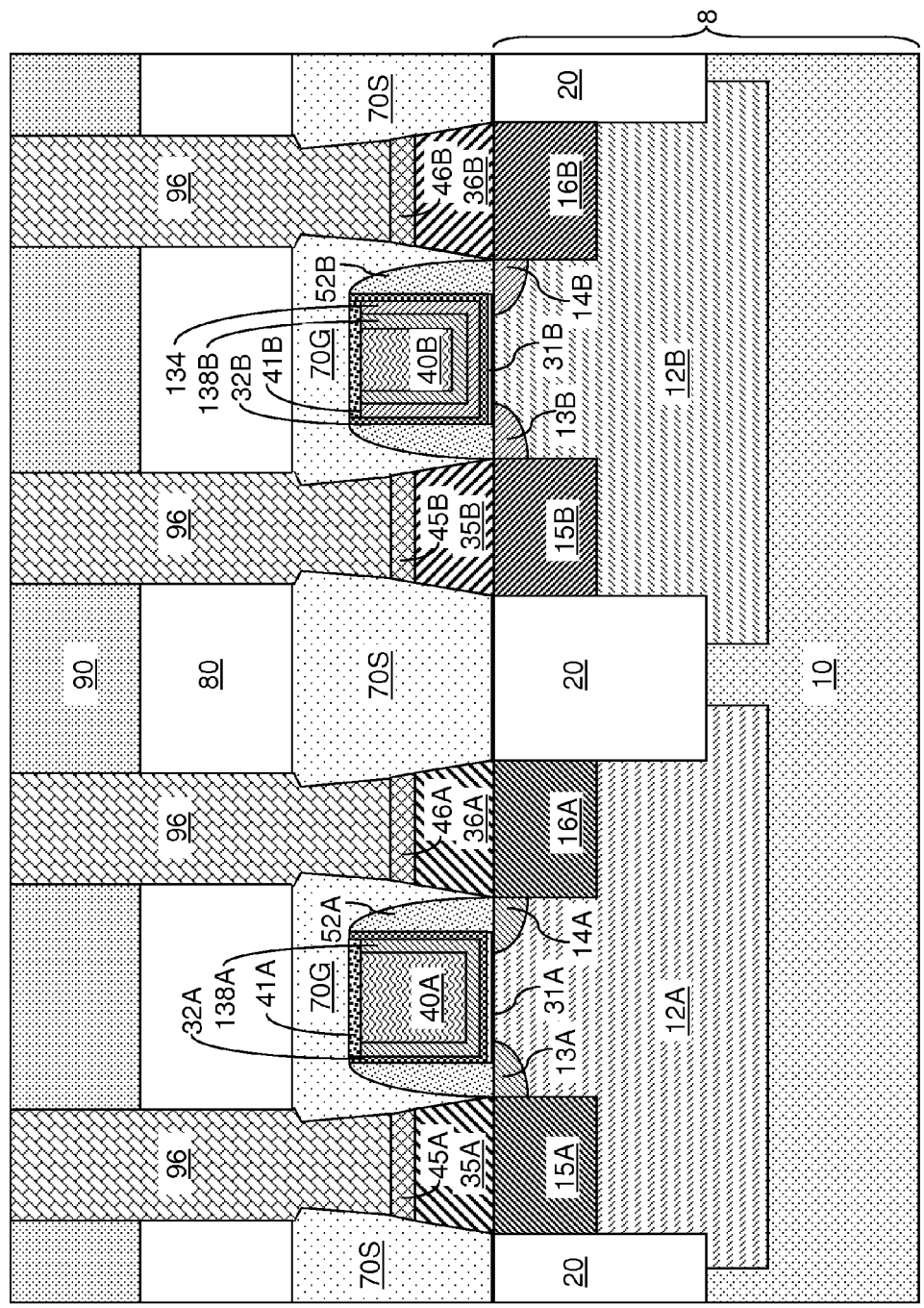
FIG. 12 is a vertical cross-sectional view of a variation of the first exemplary semiconductor structure according to the first embodiment of the present disclosure.

Referring to FIG. 12, a variation of the first exemplary semiconductor structure can be derived from the first exemplary semiconductor structure by employing an anisotropic etch process for forming the contact cavities 99 that removes the second dielectric material with finite selectivity to the first dielectric material at the processing step of FIG. 10. In this case, the first dielectric material of the gate level dielectric layer (70G, 70S) can be eroded during the anisotropic etch, and the ledge that is coplanar with the interface between the gate level dielectric layer (70G, 70S) and the contact level dielectric layer 80 is vertically recessed below the plane of the interface during the anisotropic etch.

Figure 13:
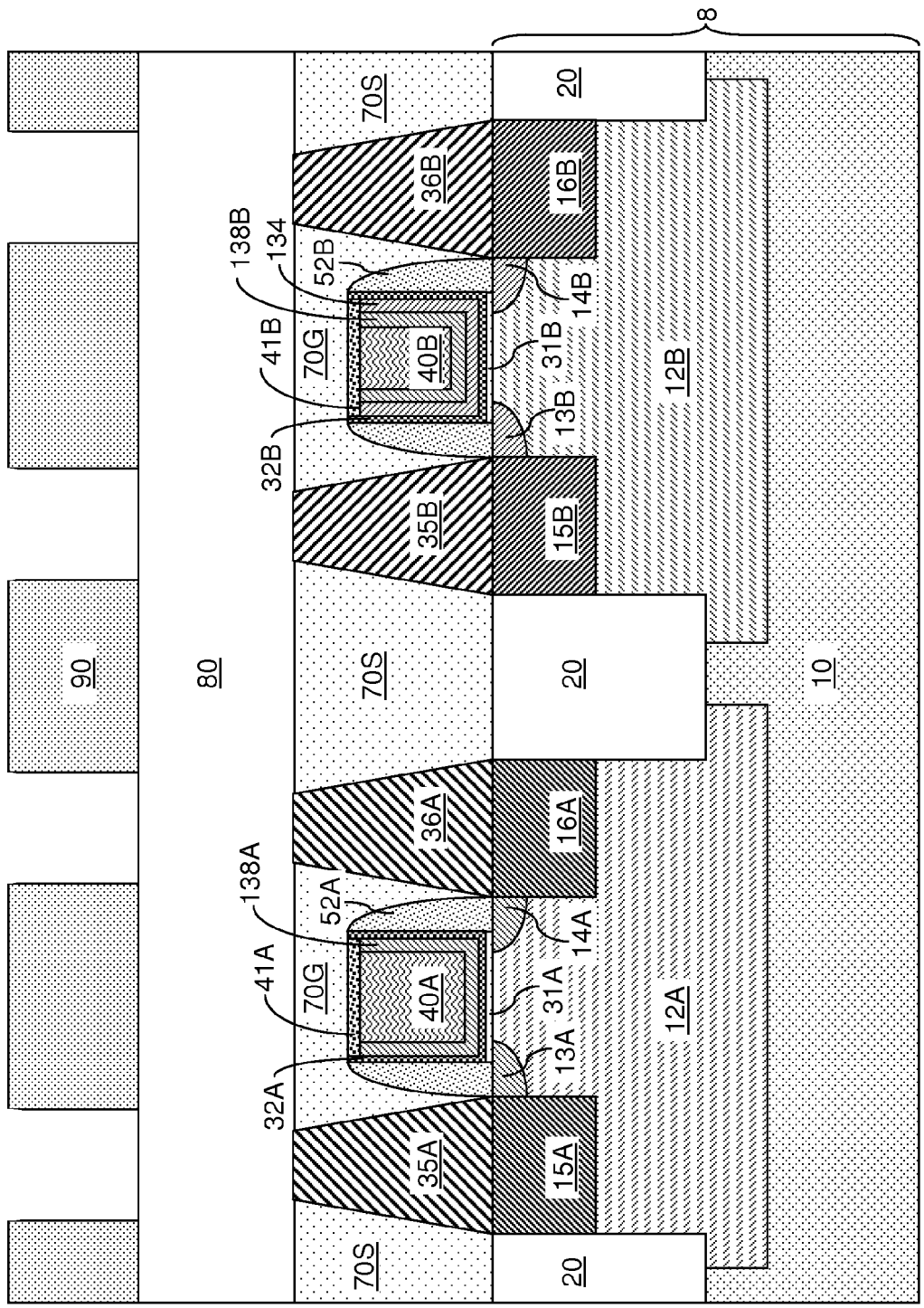
FIG. 13 is a vertical cross-sectional view of a second exemplary semiconductor structure after deposition of a second dielectric material to form a contact level dielectric layer and deposition and patterning of an optional dielectric cap layer according to a second embodiment of the present disclosure.

Referring to FIG. 13, a second exemplary semiconductor structure according to a second embodiment of the present disclosure can be derived from the first exemplary semiconductor structure of FIG. 7 by omitting the processing steps of FIG. 8 and performing the processing steps of FIG. 9.

Figure 14:
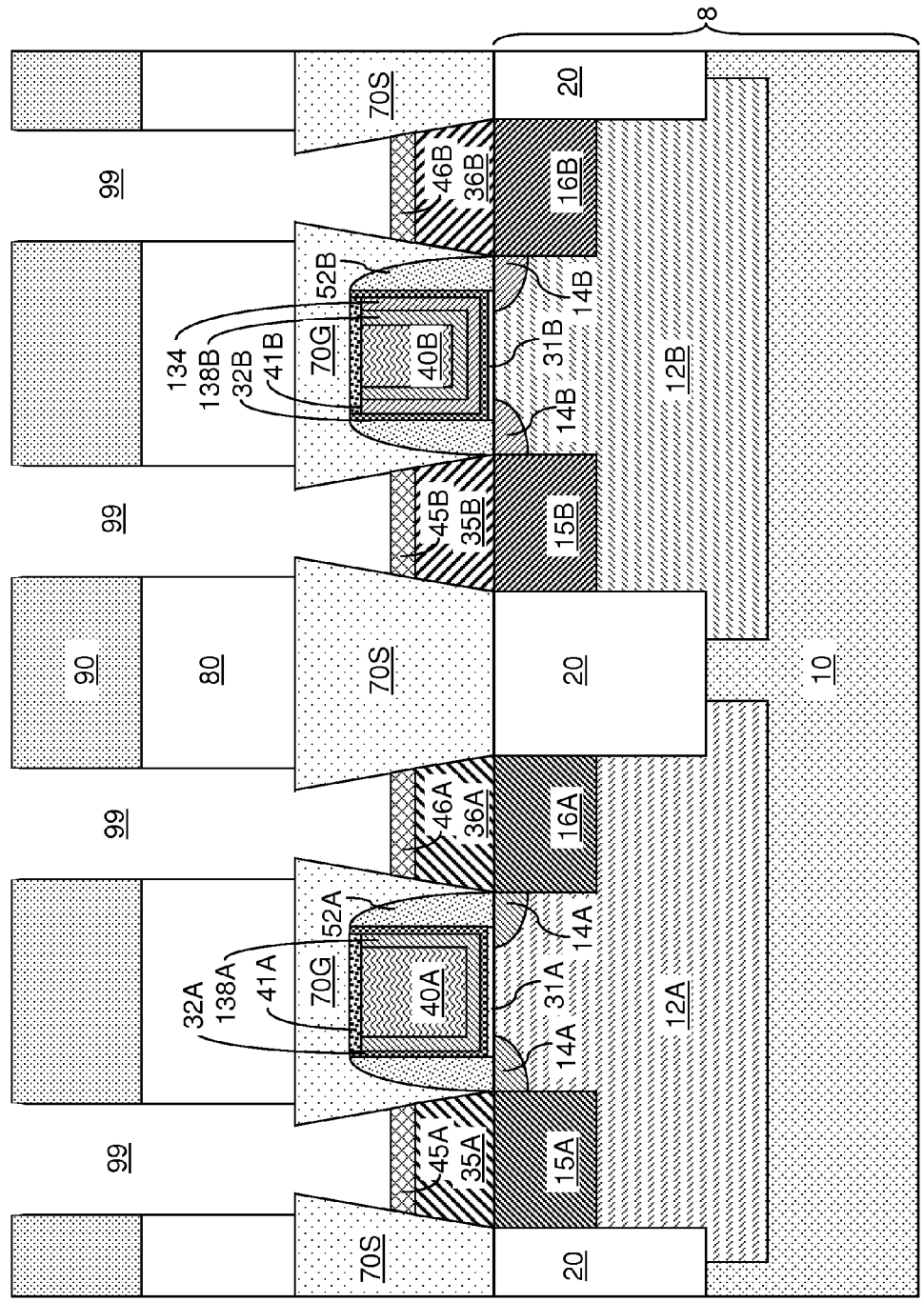
FIG. 14 is a vertical cross-sectional view of the second exemplary semiconductor structure after formation of a contact level dielectric layer and various cavities and recessing of top surfaces of the raised semiconductor structures according to the second embodiment of the present disclosure.

Referring to FIG. 14, is contact cavities 99 are formed through the optional dielectric cap layer 90 and the contact level dielectric layer 80 employing the same processing steps as in the first embodiment until top surfaces of the raised semiconductor structures (35A, 36A, 35B, 36B) are physically exposed at the horizontal plane of the interface between the gate level dielectric layer (70G, 70S) and the contact level dielectric layer 80. Each contact cavity 99 is formed in the second dielectric material by etching an unmasked portion of the second dielectric material. The optional dielectric cap layer 90 or a photoresist layer (not shown) can function as a making layer that defines the pattern of the contact cavities 99.

The chemistry of the anisotropic etch is selected such that the anisotropic etch removes the second dielectric material selective to the first dielectric material. Thus, after the top surfaces of the raised semiconductor structures (35A, 36A, 35B, 36B) are physically exposed within the contact cavities 99, the first dielectric material is not etched in any significant amount.

In one embodiment, the chemistry of the anisotropic etch that removes the second dielectric material is not selective to the second semiconductor material. In this case, the same etch chemistry may be employed to vertically recess top surfaces of the raised semiconductor structures (35A, 36A, 35B, 36B). In another embodiment, the chemistry of the anisotropic etch may be changed once the top surfaces of the raised semiconductor structures (35A, 36A, 35B, 36B) are physically exposed within the contact cavities 99. In this case, an etch chemistry that removes the second semiconductor material selective to the first dielectric material can be employed during etching of the top portion of each raised semiconductor structures (35A, 36A, 35B, 36B).

Each contact cavity 99 is extended downward by an etch that removes a top portion of each raised semiconductor structure (35A, 36A, 35B, 36B) selective to the first dielectric material. Optionally, metal-semiconductor alloy regions (45A, 46A, 45B, 46B) can be formed in the same manner as in the first embodiment.

The processing steps of FIG. 11 can be subsequently performed to provide a semiconductor structure that is identical to the exemplary semiconductor structure of FIG. 11 or a variation thereof as illustrated in FIG. 12.

The lower portions of the contact via structures 96 are self-aligned to the various raised semiconductor structures (35A, 36A, 35B, 36B). Thus, a wider processing window can be provided for overlay tolerance during lithographic patterning of a photoresist layer including the pattern for the various contact via cavities 96 compared to processing schemes known in the art.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
   forming a replacement gate structure embedded within a planarization dielectric layer on a semiconductor substrate;
   removing said planarization dielectric layer to physically expose a semiconductor surface;
   forming a raised semiconductor structure by depositing a faceted semiconductor material on said physically exposed semiconductor surface to a height above a topmost surface of said replacement gate structure;
   depositing a first dielectric material over said replacement gate structure and said raised semiconductor structure;
   recessing a top surface of said raised semiconductor structure;
   depositing a second dielectric material over said deposited first dielectric material, wherein a portion of said second dielectric material is deposited directly over said recessed top surface of said raised semiconductor structure and below a planar interface between said second dielectric material and said first dielectric material; and
   forming a cavity by etching another portion of said second dielectric material overlying said portion of said second dielectric material and subsequently etching said portion of said second dielectric material selective to said first dielectric material.

2. The method of claim 1, further comprising planarizing said first dielectric material employing said raised semiconductor structure as a stopping structure to provide a gate level dielectric layer having a planar top surface, wherein said top surface of said raised semiconductor structure is recessed after said planarization of said first dielectric material.

3. The method of claim 1, wherein a lower portion of said cavity embedded within said first dielectric material is narrower than an upper portion of said cavity embedded within said second dielectric material.

4. The method of claim 3, wherein said cavity includes a ledge located at, or below, an interface between said first dielectric material and said second dielectric material.

5. The method of claim 1, wherein said forming said replacement gate structure comprises a step of oxidizing a surface portion of said replacement gate structure to form a dielectric metal oxide portion.

6. The method of claim 1, wherein said removing said planarization dielectric layer to physically expose said semiconductor surface is performed by and isotropic etch or by an anisotropic etch.

7. The method of claim 1, wherein said forming said raised semiconductor structure comprises selectively depositing a semiconductor material.

8. The method of claim 1, wherein said raised semiconductor structure comprises a crystallographic facet having a crystallographic surface extending from a top surface of said semiconductor substrate to a topmost surface of said raised semiconductor structure.

9. The method of claim 8, wherein an angle of said crystallographic facet of the raised semiconductor structure relative to a surface normal of an interface between said replacement gate structure and said semiconductor substrate is a tapered angle.

10. The method of claim 9, wherein said tapered angle, is from 5 degrees to 75 degrees.

11. The method of claim 1, further comprising forming a metal-semiconductor alloy region at a bottom of said cavity.

12. A method of forming a semiconductor structure comprising:
   forming a replacement gate structure embedded within a planarization dielectric layer on a semiconductor substrate;
   removing said planarization dielectric layer to physically expose a semiconductor surface;
   forming a raised semiconductor structure by depositing a faceted semiconductor material on said physically exposed semiconductor surface to a height above a topmost surface of said replacement gate structure;
   depositing a first dielectric material over said replacement gate structure and said raised semiconductor structure;
   planarizing said first dielectric material employing said raised semiconductor structure as a stopping structure;

depositing a second dielectric material over said first dielectric material;

forming a cavity in said second dielectric material by etching an unmasked portion of said second dielectric material; and extending said cavity downward by said recessing of said top surface of said raised semiconductor structure.

13. The method of claim 12, wherein said downward extension of said cavity is performed by an etch that removes a top portion of said raised semiconductor structure selective to said first dielectric material.

14. The method of claim 12, further comprising forming a metal-semiconductor alloy region at a bottom of said cavity.

* * * * *